United States Patent
Yang

[19]

[11] Patent Number: 6,163,871
[45] Date of Patent: Dec. 19, 2000

[54] RAM BASED ERROR CORRECTION CODE ENCODER AND SYNDROME GENERATOR WITH PROGRAMMABLE INTERLEAVING DEGREES

[75] Inventor: Honda Yang, Santa Clara, Calif.

[73] Assignee: Adaptec, Inc., Milpitas, Calif.

[21] Appl. No.: 09/087,433

[22] Filed: May 29, 1998

[51] Int. Cl.$^7$ .......................... G11C 29/00; H03M 13/00
[52] U.S. Cl. .......................... 714/769; 714/765; 714/781; 714/785
[58] Field of Search .................... 714/755, 756, 714/762, 769, 774, 784, 785, 765, 781

[56] References Cited

U.S. PATENT DOCUMENTS

| | | | |
|---|---|---|---|
| 4,584,686 | 4/1986 | Fritze | 714/784 |
| 4,667,326 | 5/1987 | Young et al. | 714/762 |
| 4,777,635 | 10/1988 | Glover | 714/756 |
| 5,068,858 | 11/1991 | Blaum et al. | 714/774 |
| 5,444,719 | 4/1986 | Cox et al. | 714/769 |
| 5,701,314 | 12/1997 | Armstrong et al. | 714/765 |
| 5,719,884 | 2/1998 | Roth et al. | 714/755 |
| 5,805,617 | 9/1998 | Im | 714/785 |

OTHER PUBLICATIONS

S. Lin and D. Costello, Jr., "*Error Control Coding*", Published Oct. 1982, © 1983, Prentice–Hall, Inc. Englewood Cliffs, NJ, pp. 167–174.

S. Wilson, "*Digital Modulation and Coding*", 1996, Ch. 5, pp. 470–472, Prentice–Hall, NJ.

N. Glover and T. Dudley, "*Practical Error Correction Design for Engineers*", 1991, Cirrus Logic, Inc., CO, Rev. 2$^{nd}$ Ed.

W.W. Peterson and E.J. Weldon, Jr., "*Error–Correcting Codes*", 1972, (12$^{th}$ printing 1994), Mass, Inst. Of Technology, pp. 131–136.

S.B. Wicker, "*Error Control Systems for Digital Communication and Storage*", CH. 9, "*The Decoding of BCH and Reed–Solomon Codes*", pp. 203–234, 1995 Prentice Hall, NJ.

*Primary Examiner*—Emmanuel L. Moise
*Attorney, Agent, or Firm*—Martine Penilla & Kim, LLP

[57] ABSTRACT

Encoders, syndrome generators, and methods for generating ECC check bytes and partial syndromes from a user data sector using a single RAM unit. The user data includes a plurality of data bytes. The encoder includes a storage unit and encoder circuitry. The storage unit is configured to receive and store a plurality of interim check bytes. The encoder circuitry is configured to receive the data bytes of the user data sector sequentially and the interim check bytes to generate a plurality of new interim check bytes in accordance with a generator polynomial. The new interim check bytes is generated after each data bytes of the data sector is received. The encoder circuitry is arranged to receive the interim check bytes from the storage unit such that the encoder circuitry generates the new interim check bytes and stores the generated new interim check bytes in the storage unit as the interim check bytes. The interim check bytes stored in the storage unit correspond to the ECC check bytes when the interim check bytes have been generated in response to all the bytes of the user data sector.

100 Claims, 9 Drawing Sheets

RAM BASED ERROR CORRECTION CODE ENCODER AND SYNDROME GENERATOR WITH PROGRAMMABLE INTERLEAVING DEGREES

BACKGROUND OF THE INVENTION

1. Field of the Invention

This invention relates generally to hard disk error correction code encoders and decoders, and more particularly to devices for generating check bytes and syndromes.

2. Description of the Related Art

Modern computer systems typically include one or more hard disk drives in which a large amount of data, including operating system files, application programs, and files may be stored. Hard disk drives typically store information in sequence by using magnetic technology. As is common in most recording technology, reading the sequential data bits from a hard disk often generates errors due to noise, manufacturing imperfections of the physical medium, dust, etc.

To detect and correct such errors, hard disk drives typically implement an error correction code (ECC) scheme in writing to and reading from hard disk drives. These hard disk drives generally include ECC circuitry that implements ECC schemes using well known codes such as Reed-Solomon code to encode user data to enable reliable recovery of the original data through the use of an ECC decoder. As is well known, ECC coding schemes assist in achieving a higher areal density.

In general, conventional ECC circuitry implements ECC encoders and syndrome generators in accordance with well known generator polynomials. For example, a Reed-Solomon encoder and syndrome generator may implement a generator polynomial g(X) as follows:

$$g(X)=(X+\alpha^m)(X+\alpha^{m+1})(X+\alpha^{m+2})(X+\alpha^{m+3})(X+\alpha^{m+4})(X+\alpha^{m+5})=X^6+\alpha^a X^5+\alpha^b X^4+\alpha^c X^3+\alpha^d X^2+\alpha^e X+\alpha^f.$$

In the past, generator polynomials have been typically implemented through the use of linear feedback shift registers with feedback connections corresponding to coefficients of the generator polynomials. For example, in writing to a hard disk medium, traditional ECC encoders typically compute ECC check bytes for a given block of user data such as a sector by using linear feedback shift registers. Prior Art FIG. 1 illustrates a conventional ECC encoder 100 that is used in generating exemplary ECC check bytes employing a plurality of linear feedback shift registers 118, 120, 122, 124, 126, and 128. The shift registers 118, 120, 122, 124, 126, and 128 are initially set to zero.

The ECC encoder 100 includes a plurality of well known Galois Field (GF) adders 102, 130, 132, 134, 136, and 138, each of which is functionally equivalent to exclusive-OR (XOR) gates. The GF adder 102 sequentially receives a plurality of user data sectors (e.g., S1, S2, S3, etc.), each of which typically comprises 512 user data bytes. In particular, the GF adder 102 receives each of the user data sectors byte-wise, one byte at a time. The GF adder 102 performs an XOR operation on the inputs and feeds the output to constant multipliers 106, 108, 110, 112, 114, and 116, respectively, for multiplication with constants $\alpha^f$, $\alpha^e$, $\alpha^d$, $\alpha a^c$, $\alpha^b$, and $\alpha^a$, respectively. An AND gate 104 is set to "1" to transmit the output from the GF adder 102 to the constant multipliers 106 through 116 as long as the GF adder 102 receives a user byte.

With continuing reference to Prior Art FIG. 1, the output of the constant multiplier 106 is fed into the shift register 118 while the outputs of the constant multipliers 108, 110, 112, 114, and 116, respectively, are fed into GF adders 130, 132, 134, 136, and 138, respectively. The GF adders 130, 132, 134, 136, 138, and 102 are also arranged to receive the contents of shift registers 118, 120, 122, 124, 126, and 128, respectively. The added output from each of the GF adders 130, 132, 134, 136, and 138 is then fed into shift registers 120, 122, 124, 126, and 128, respectively.

In this configuration, as the next byte of a sector is received, the contents of the shift registers 118, 120, 122, 124, 126, and 128, respectively, are used to generate a sum through the GF adders 130, 132, 134, 136, 138, and 102, respectively. After the last byte of a sector has been received and processed, the shift registers 118 through 128 will contain six check bytes. These six check bytes are then shifted out of the registers 118 through 128 as an output signal ECCCHK by feeding a "0" into an the AND gate 104. As the ECC check bytes are generated, the ECC bytes are appended to the sector of user data and then recorded (e.g., written) on a hard disk medium.

On the other hand, when recorded sectors of ECC encoded data are read from a hard disk medium, conventional ECC decoders decode the received data sectors including the ECC check bytes by generating partial syndromes for the ECC encoded data sectors. Partial syndromes are well known in the art and are used to detect errors in the associated sector (e.g. presence of errors, location of errors, and error patterns). Typically, conventional ECC decoders include a syndrome generator, which generates partial syndromes by using feedback shift registers.

Prior Art FIG. 2 illustrates a conventional ECC syndrome generator 200 that generates partial syndromes PS0, PS1, PS2, PS3, PS4, and PS5 by using a plurality of registers 202, 204, 206, 208, 210, and 212. The ECC syndrome generator 200 receives a stream of ECC encoded data sectors such as S1', S2', S3', etc. Each of the data sectors includes a plurality of ECC check bytes appended to the user data portion of the data sector.

The syndrome generator 200 includes a plurality of GF adders 214, 216, 218, 220, 222, and 224, which are configured to sequentially receive, as an input, the bytes of a data sector, one byte at a time. As in the ECC encoder 100, the GF adders 214 through 224 perform functions that are equivalent to XOR gates. A plurality of constant multipliers 226, 228, 230, 232, 234, and 236 are configured to receive and multiply the content of the feedback registers 202, 204, 206, 208, 210, and 212, respectively, with associated constants $\alpha^m$, $\alpha^{m+1}$, $\alpha^{m+2}$, $\alpha^{m-3}$, $\alpha^{m+4}$, and $\alpha^{m+5}$, respectively. The product from the constant multipliers 226, 228, 230, 232, 234, and 236 are then fed into the GF adders 214, 216, 218, 220, 222, and 224, respectively, an inputs. In this manner, the constant multipliers 226 through 236 provide a feedback path for the associated registers.

In this feedback register configuration, the registers 202 through 212 are initially set to zero before receiving the first byte of a data sector. Accordingly, the GF adders 214 through 224 merely pass the first byte to the associated shift register. Thereafter, the first byte from each of the registers 202 through 212 is multiplied with the associated constant. The resulting product is then provided to an associated GF adder as an input. The GF adders 214 through 224 then adds the associated input with the next data byte of the data sector. The sum of each of the GF adders 214 through 224 is then stored back into the associated register.

When the last byte (e.g., the last check byte) of the sector has been received and processed, the partial syndromes for the received sector is generated and stored in the registers 202, 204, 206, 208, 210, and 212. The generated partial syndromes indicate the presence of errors in the sector. From the partial syndromes, an ECC decoder may generate error locations and error patterns in the sector for error correction.

Unfortunately, the registers found in conventional ECC encoders and syndrome generators can become too costly when the number of check bytes are increased. For example, each additional check byte requires an additional register with supporting feedback circuit elements. Consequently, as the number of check bytes are increased to a high number, the use of registers may become too costly to implement.

Furthermore, conventional ECC circuitry typically includes a programmable interleaving degree feature to correct worst case error bursts of various lengths. Implementing the programmable interleaving degree, however, escalates the cost of the ECC circuitry. For example, an ECC encoder with interleaving degree of three generally requires three times the shift registers of an ECC encoder with no interleaving degree. In addition, accommodating a programmable interleaving degrees in these conventional ECC circuitry would require complex and costly multiplexing circuit within each shift stage. Hence, implementing linear feedback shift registers for providing programmable interleaving degrees may be economically impractical for ECC circuitry.

Thus, what is needed is a device and method that can implement ECC encoding and syndrome generation without the cost associated with linear feedback shift registers and supporting circuitry. What is further needed is a device and method that are readily scaleable to accommodate varying number of ECC check bytes, partial syndromes, and interleave degrees.

SUMMARY OF THE INVENTION

Broadly speaking, the present invention fills these needs by providing a device and a method for encoding ECC check bytes and generating partial syndromes using a RAM unit. It should be appreciated that the present invention can be implemented in numerous ways, including as a process, an apparatus, a system, a device, a method, or a computer readable medium. Several inventive embodiments of the present invention are described below.

In one embodiment, the present invention provides an ECC encoder for generating ECC check bytes from a user data sector. The user data includes a plurality of data bytes. The encoder includes a storage unit and encoder circuitry. The storage unit is configured to receive and store a plurality of interim check bytes. The encoder circuitry is configured to receive the data bytes of the user data sector sequentially and the interim check bytes to generate a plurality of new interim check bytes in accordance with a generator polynomial. The new interim check bytes are generated after each data byte of the data sector is received. The encoder circuitry is arranged to receive the interim check bytes from the storage unit such that the encoder circuitry generates the new interim check bytes and stores the generated new interim check bytes in the storage unit as the interim check bytes. The interim check bytes stored in the storage unit correspond to the ECC check bytes when the interim check bytes have been generated in response to all the bytes of the user data sector.

In another embodiment, the present invention provides a method for generating error correction coded (ECC) check bytes for a user data sector. The user sector includes a plurality of data bytes. The method includes: (a) generating a plurality of interim check bytes; (b) receiving a data byte of the user sector; (c) generating a plurality of new interim check bytes in response to the received data byte and the interim check bytes in accordance with a generator polynomial; (d) storing the new interim check bytes in a storage unit as the interim check bytes; (e) repeating operations (b) and (d) for all the data bytes of the user sector in sequence. The interim check bytes generated and stored in the storage unit in response to all the data bytes of the user sector correspond to the ECC check bytes.

In yet another embodiment, the present invention provides a syndrome generator for generating partial syndromes from a data sector. The data sector includes a plurality of data bytes. The syndrome generator includes a storage unit and syndrome generator circuitry. The storage unit is configured to receive and store a plurality of interim syndromes. The syndrome generator circuitry is configured to receive the data bytes of the data sector sequentially and the interim syndromes to generate a plurality of new interim syndromes in accordance with a generator polynomial. The new interim syndromes are generated after each data byte of the data sector is received. The syndrome generator circuitry is arranged to receive the interim syndromes from the storage unit such that the syndrome generator circuitry generates the new interim syndromes and stores the generated new interim syndromes in the storage unit as the interim syndromes. The interim syndromes correspond to the partial syndromes when the interim syndromes have been generated in response to all the bytes of the data sector.

In still another embodiment, the present invention provides a method for generating partial syndromes from a data sector, which includes a plurality of data bytes. The method includes: (a) generating a plurality of interim syndromes; (b) receiving a data byte of the data sector; (c) generating a plurality of new interim syndromes in response to the received data byte and the interim syndromes accordance with a generator polynomial; (d) storing the new interim syndromes in a storage unit as the interim syndromes; (e)repeating operations (b) and (d) for all the data bytes of the data sector in sequence. The interim syndromes generated in response to all the data bytes correspond to the partial syndromes.

In another embodiment, the present invention provides a device for generating ECC check bytes and partial syndromes from a data sector using a single shared memory unit. The data sector includes a plurality of data bytes. The device receives a signal indicating whether the data sector is to be written to or read from a storage medium coupled to the device. The device generates the check bytes when the signal indicates a write operation to the storage medium and the partial syndromes when the signal indicates a read operation from the storage medium. The device includes a storage unit, encoder circuitry, and syndrome generator circuitry. The storage unit is configured to receive and store a plurality of interim data bytes. The encoder circuitry is configured to sequentially receive the data bytes of the data sector and the interim data bytes to generate a plurality of interim check bytes in accordance with a first generator polynomial when the signal indicates the write operation. The interim check bytes are generated after each data byte of the data sector is received. The encoder circuitry is arranged to store the interim check bytes in the storage unit as the interim data bytes. The interim data bytes correspond to the check bytes when the interim check bytes have been generated in response to all the bytes of the user data sector.

The syndrome generator circuitry is configured to sequentially receive the data bytes of the data sector and the interim data bytes to generate a plurality of interim syndromes in accordance with a second generator polynomial when the signal indicates the read operation. The interim syndromes are generated after each data bytes of the data sector is received. The syndrome generator circuitry is arranged to store the interim syndromes in the storage unit as the interim data bytes. The interim data bytes correspond to the partial syndromes when the interim syndromes have been generated in response to all the bytes of the user data sector.

In yet another embodiment, the present invention provides a method for generating ECC check bytes and partial syndromes from a data sector using a single shared memory unit. The data sector includes a plurality of data bytes. The method includes: (a) receiving a signal indicating whether the check bytes or the partial syndromes are to be generated for the data sector; (b) generating a plurality of interim bytes, the interim bytes being interim check bytes when the signal indicates the generation of the check bytes and the interim bytes being interim syndromes when the signal indicates the generation of the partial syndromes; (c) receiving a data byte of the data sector; (d) generating a plurality of new interim bytes in response to the received data byte and the interim bytes in accordance with a generator polynomial; (e) storing the new interim bytes in a storage unit as the interim bytes; (f) repeating operations (c) and (e) for all the data bytes of the data sector in sequence. When the signal indicates the generation of the check bytes, the interim bytes generated in response to all the data bytes corresponds to the check bytes. On the other hand, the interim bytes generated in response to all the data bytes correspond to the partial syndromes when the signal indicates the generation of the partial syndromes.

In still another embodiment, a device for generating error correction code (ECC) check bytes and partial syndromes from a data sector using a single shared memory unit is disclosed. The data sector includes a plurality of data bytes. The device receives a signal indicating whether the data sector is to be written to or read from a storage medium coupled to the device. The device generates the check bytes when the signal indicates a write operation to the storage medium and the partial syndromes when the signal indicates a read operation from the storage medium. The device includes storing means for receiving and storing a plurality of interim data bytes, encoding means, and syndrome generating means. The encoding means is configured to sequentially receive the data bytes of the data sector and the interim data bytes for generating a plurality of interim check bytes in accordance with a first generator polynomial when the signal indicates the write operation. The interim check bytes are generated after each of the data bytes of the data sector is received. The encoding means is arranged to store the interim check bytes in the storing means as the interim data bytes. The interim data bytes correspond to the check bytes when the interim check bytes have been generated in response to all the bytes of the user data sector.

The syndrome generating means is configured to sequentially receive the data bytes of the data sector and the interim data bytes in order to generate a plurality of interim syndromes in accordance with a second generator polynomial when the signal indicates the read operation. The interim syndromes are generated after each data byte of the data sector is received. The syndrome generating means is arranged to store the interim syndromes in the storing means as the interim data bytes. The interim data bytes correspond to the partial syndromes when the interim syndromes have been generated in response to all the bytes of the user data sector.

Advantageously, the present invention provides a device and method for generating ECC check bytes and syndromes using a random access memory (RAM) unit instead of shift registers. Furthermore, the RAM unit provides a scaleable storage unit for implementing programmable interleaves and accommodating varying number of check bytes and syndrome. Accordingly, the device and method of the present invention result in significant savings in cost and resources, particularly when the number of interleaves and the number of check bytes and syndromes increase. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

Prior Art

Prior Art

DETAILED DESCRIPTION OF THE PREFERRED EMBODIMENTS

An invention is described for a device and method for generating ECC check bytes and partial syndromes using a RAM unit. It will be obvious, however, to one skilled in the art, that the present invention may be practiced without some or all of these specific details. In other instances, well known process operations have not been described in detail in order not to unnecessarily obscure the present invention.

Figure 3:
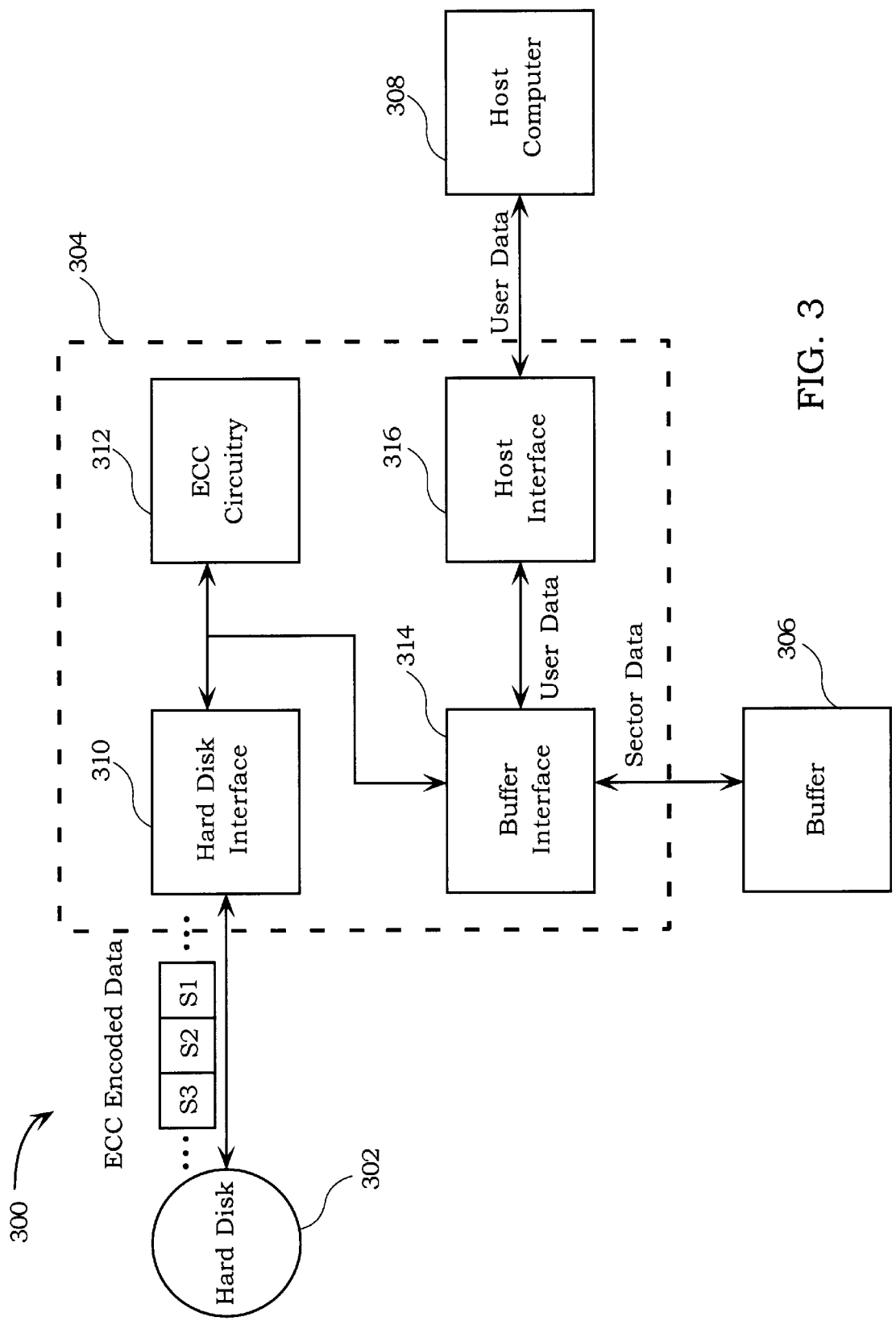
FIG. 3 illustrates a block diagram of a computer system in accordance with one embodiment of the present invention.

FIG. 3 illustrates a block diagram of a computer system 300 in accordance with one embodiment of the present invention. The computer system 300 includes a hard disk 302, a hard disk controller 304, a buffer 306, and a host computer 308. The hard disk controller 304 is coupled to the host computer 308 to communicate user data that are used or generated by the host computer 308 to and from the hard disk 302. The hard disk controller 304 is also coupled to the buffer 306 to communicate and store sector data for ECC encoding and decoding. Although the buffer 306 is described in connection with ECC encoding and decoding, those skilled in the art will readily appreciate that the buffer 306 may be shared among multiple ports such as the host computer 308, dynamic random access memory (DRAM) refresh, hard disk controller 304, etc.

The hard disk 302 includes a plurality of tracks and contains ECC encoded data in a plurality of sectors laid out sequentially in a linear fashion in the tracks. The hard disk controller 304 includes a hard disk interface 310 (e.g., hard disk manager), ECC circuitry 312, a buffer interface 314, and a host interface 316. In this configuration, the hard disk interface 310 is coupled to the hard disk 302 to transmit and receive the ECC encoded data to and from the buffer 306 in the form of data sectors (e.g., S1, S2, S3, etc.). Each of these data sectors include user data and a number of check bytes appended to the associated user data. The hard disk interface 310 also provides interface functions such as synchronization, sector identification, and sector data transmission, and the like, between the hard disk 302 and the rest of the computer system 300. The buffer interface 314 is coupled to the buffer 306 for providing controlled access to the buffer 306. At the other end of the hard disk controller 304, the host computer 308 is coupled to the host interface 316 to transmit and receive user data.

Within the hard disk controller 304, the buffer interface 314 is coupled to the host interface 316 to transmit and receive user data to and from the buffer 306. In addition, the buffer interface 314 is coupled to the ECC circuitry 312 and the hard disk interface 310 to receive and transmit sector data to and from the buffer 306 to enable the ECC circuitry 312 to perform ECC encoding and decoding on the sector data. For instance, when writing to the hard disk 302, the host computer 308 generates and transmits user data to the buffer 306 through the host interface 316 and the buffer interface. The buffer interface 314 also transmits the user data to the ECC circuitry 312, which encodes the user data in ECC format by generating a number of check bytes. The user data and the associated check bytes are then transmitted to the hard disk interface 310 in sequence. The hard disk interface 310 then transmits the ECC encoded sector data (e.g., sectors S1, S2, S3, etc.) to the hard disk 302 for recording (i.e., storage).

On the other hand, when reading from the hard disk 302, the hard disk interface 310 receives sector data (e.g., sectors S1, S2, S3, etc.) from the hard disk 302 and transmits the sector data to the ECC circuitry 312 and the buffer interface 314 in parallel. The buffer interface 314 transmits the sector data to the buffer 306 for storage. The ECC circuitry 312 decodes the ECC encoded sector data on a sector by sector basis. Specifically, using the received sector data, the ECC circuitry 312 generates partial syndromes and error locations and patterns for each of the data sector. The ECC circuitry 312 then corrects the errors by accessing the associated data sector stored in the buffer 306 through the buffer interface 314. The corrected data are then stored back into the buffer 306. The buffer interface 314 then releases the corrected sector data to the host computer 308 through the host interface 316.

Figure 3A:
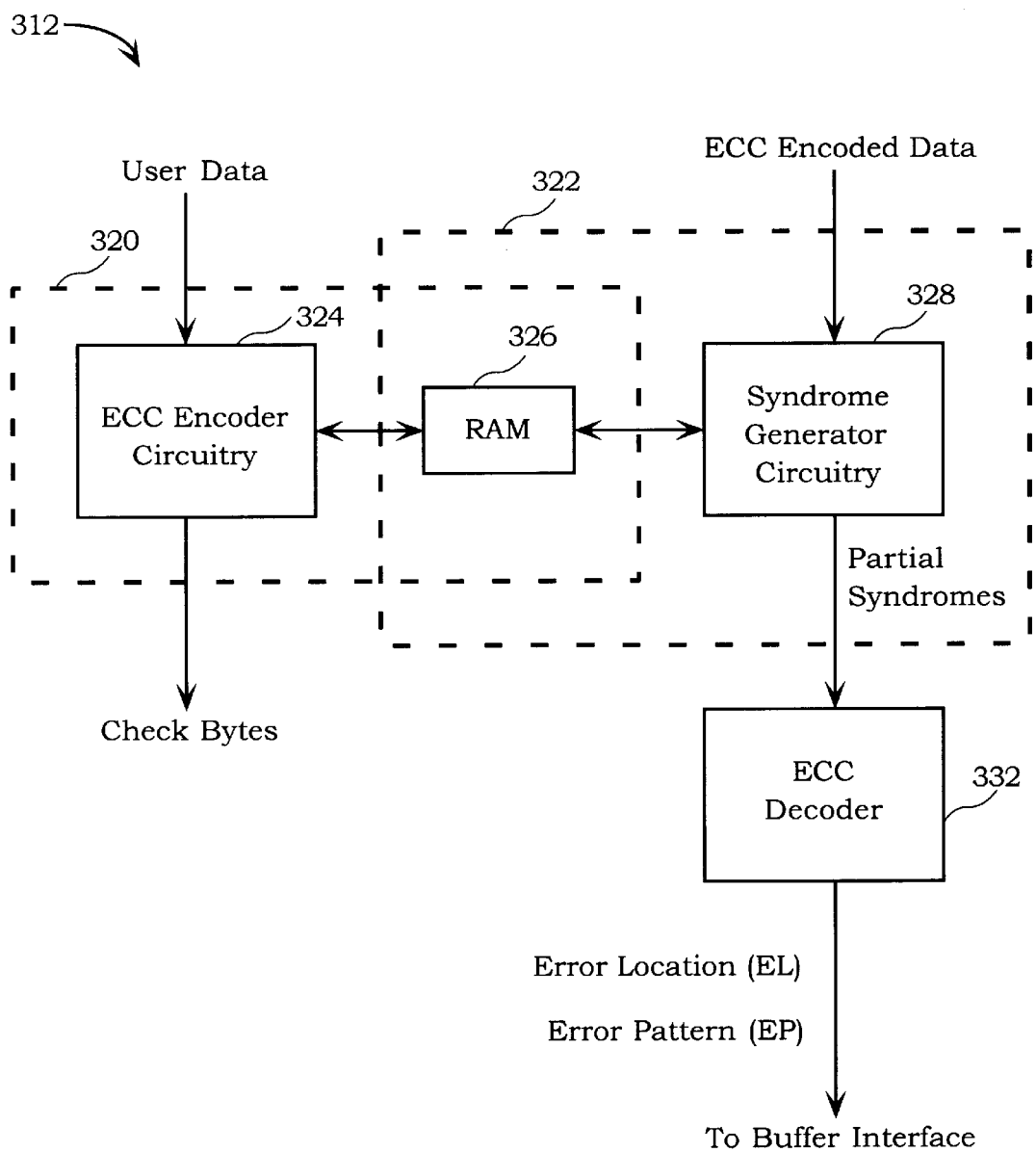
FIG. 3A illustrates a more detailed block diagram of ECC circuitry in accordance with one embodiment of the present invention.

FIG. 3A illustrates a more detailed block diagram of the ECC circuitry 312 in accordance with one embodiment of the present invention. The ECC circuitry 312 includes an ECC encoder 320, a syndrome generator 322, and an ECC decoder 332. The ECC encoder 320 and the syndrome generator 322 share a random access memory (RAM) unit 326.

Specifically, the ECC encoder 320 includes ECC encoder circuitry 324 and the RAM unit 326. As will be discussed further below, the ECC encoder circuitry 324 in the ECC encoder 320 generates ECC check bytes using the RAM unit 326. On the other hand, the syndrome generator 322 includes syndrome generator circuitry 328 and the RAM unit 326. The syndrome generator circuitry 328 generates partial syndromes by using the RAM unit 326.

In this configuration, when writing user data from the host computer 308 to the hard disk 302, for example, the ECC encoder circuitry 324 of the ECC encoder 320 receives the user data and generates a number of check bytes by using the RAM unit 326 in accordance with a predetermined generator polynomial. The generated check bytes are then transmitted to the hard disk 302 through the hard disk interface 310 for writing to the hard disk 302.

On the other hand, when reading sector data from the hard disk 302, the syndrome generator circuitry 328 of the syndrome generator 322 receives the ECC encoded sector data and generates partial syndromes for the received sector data using the RAM unit 326 in accordance with a predetermined generator polynomial. The syndrome generator circuitry 328 then transmits the partial syndromes to the ECC decoder 322. Based on the received partial syndromes, the ECC decoder 332 generates error locations (EL) and error patterns (EP) for the associated data sector. The error locations and error patterns are then used to access the data stored in the buffer 306 to perform error correction.

More specifically, the ECC decoder 332 is coupled to the syndrome generator 322 to receive the partial syndromes and generates error locations (EL) and error patterns (EP) for each of the data sectors. The generated error locations (EL) and error patterns (EP) are then transmitted to the buffer interface 314 to access the buffer 306 for correcting the error in the associated data sector indicated by the error location (EL). ECC decoders for generating error locations and error patterns are well known in the art.

Figure 3B:
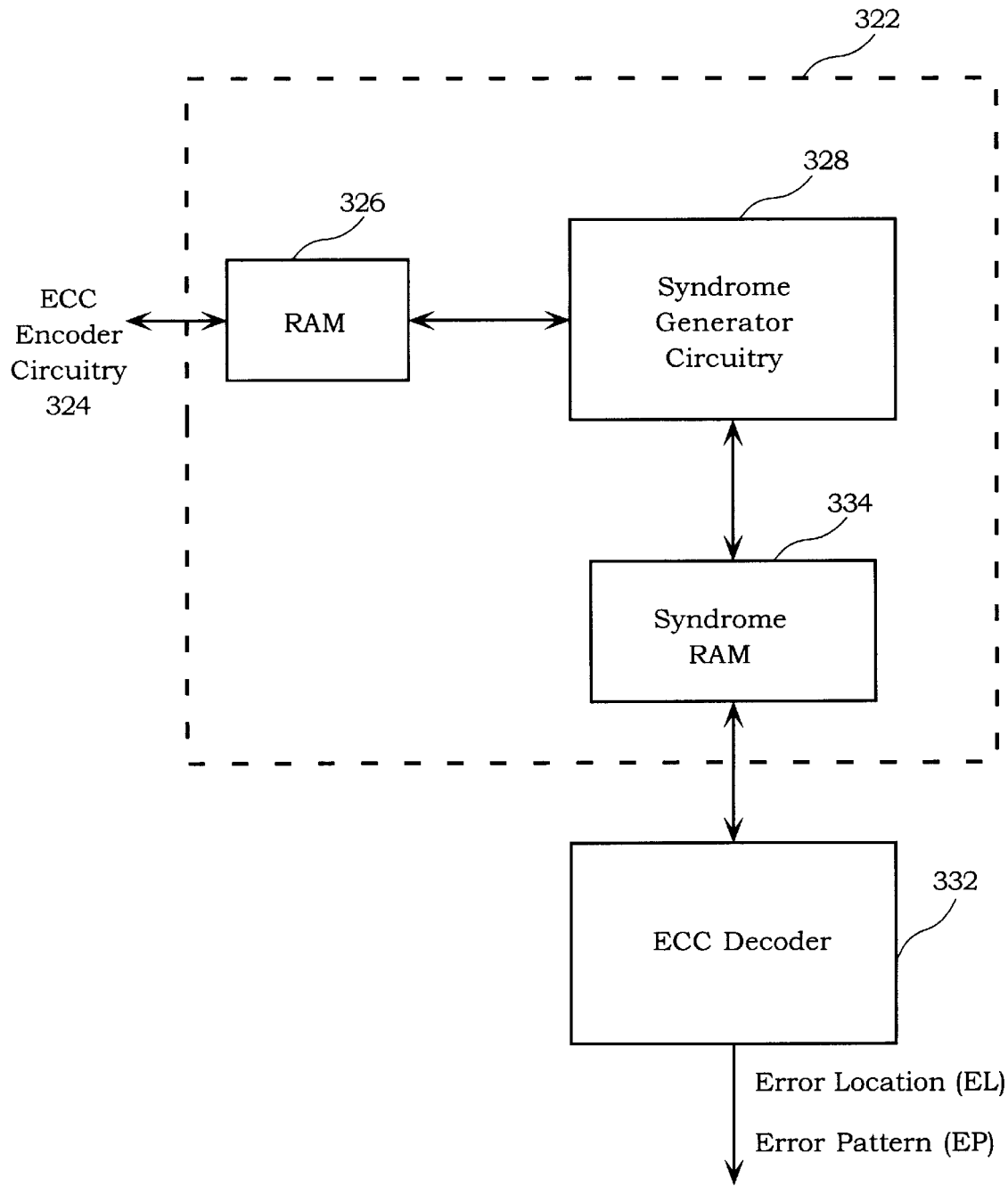
FIG. 3B illustrates a simplified block diagram a syndrome generator in accordance with one embodiment of the present invention.

FIG. 3B illustrates a simplified block diagram the syndrome generator 322 in accordance with one embodiment of the present invention. The syndrome generator includes the RAM unit 326, the syndrome generator circuitry 328, and a syndrome RAM unit 334. The syndrome RAM unit 334 is coupled between the syndrome generator 328 and the ECC decoder 332 for on-the-fly processing of sector data. Specifically, the syndrome RAM unit 334 stores the generated partial syndromes of a previous sector while the syndrome generator circuitry 328 generates partial syndromes for a current sector that is being received. The ECC decoder 332 accesses the syndrome RAM unit 334 for generating error locations and patterns for the previous sector to implement on-the-fly error detection and correction scheme. Exemplary on-the-fly error detection and correction devices and methods are described, for example, in a co-pending U.S. patent application Ser. No. 09/087,731 filed on an even day herewith, entitled "Device and Method for Extending Error Correction Beyond One Sector Time," by inventor Honda Yang, assigned to the assignee of the present application, which is incorporated herein by reference in its entirety.

In the shared memory arrangement, the RAM unit 326 is preferably assigned to the ECC encoder circuitry 324 and is accessible to the syndrome generator circuitry 328 for generating partial syndromes. In an alternative embodiment, the RAM unit 326 is assigned to the syndrome generator circuitry 328 and is accessible to the ECC encoder circuitry for generating ECC check bytes. In another embodiment, the RAM unit 326 is not shared between the ECC encoder circuitry 324 and the syndrome generator circuitry 328. Instead, one RAM unit is assigned to the ECC encoder circuitry 324 and another RAM unit is assigned to the syndrome generator circuitry 328.

In accordance with a preferred embodiment, the present invention utilizes the RAM unit 326 to provide scaleable and programmable interleaving degrees. Specifically, the RAM unit 326 may be used to perform exclusively ECC check byte generating functions and ECC syndrome generating functions at distinct times. For example, in writing to or reading from a hard disk, only one type of operation may typically be performed at a time. That is, the hard disk may not be read from and written to at the same time.

Figure 4:
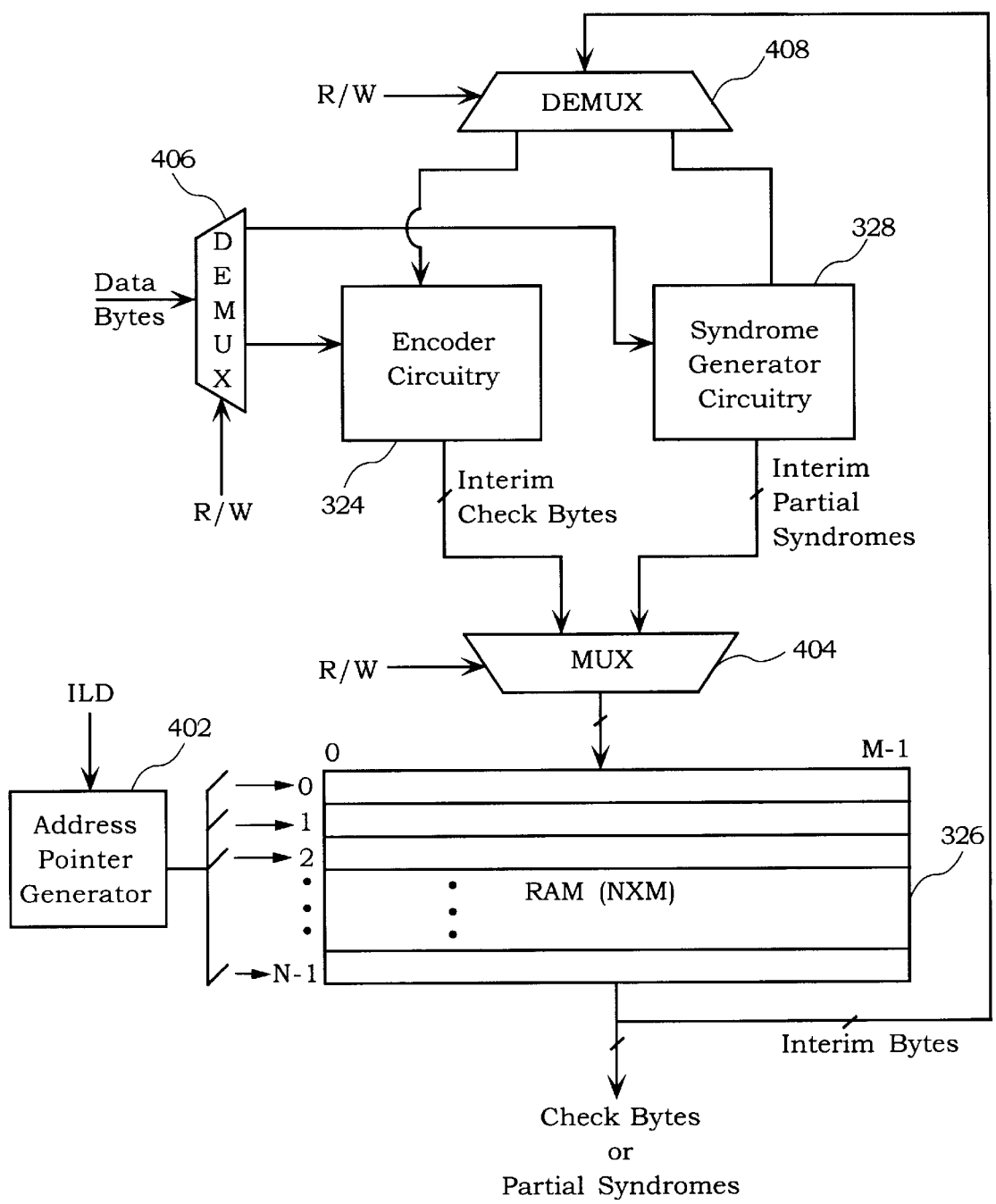
FIG. 4 illustrates a schematic diagram of a scaleable and programmable RAM unit that is shared between encoder circuitry and syndrome generator circuitry.

To implement the scaleable and programmable interleaving degree scheme, the preferred embodiment of the present invention utilizes an address pointer. FIG. 4 illustrates a schematic diagram of the scaleable and programmable RAM unit 326 that is shared between the encoder circuitry 324 and the syndrome generator circuitry 328. To accommodate M check bits per interleave and maximum N-way interleave, the RAM unit 326 in FIG. 4 is an N×M bit memory array with each memory location being associated with a particular interleave number. It should be appreciated that the RAM unit 326 of the present invention may be implemented using any suitable RAM unit such as DRAM, SRAM, SDRAM, etc.

With continuing reference to FIG. 4, a read/write (R/W) control signal is used to select either the encoder circuitry 324 or the syndrome generator circuitry 328 as the master of the RAM unit 326. For example, when R/W signal indicates that the operation is for reading data from a hard disk, a multiplexer 404 selects the syndrome generator circuitry 328 as the memory master having exclusive access to the RAM unit 326. On the other hand, when the R/W signal indicates a write operation instead, the multiplexer 404 selects the encoder circuitry 324 as the memory master of the RAM unit 326. Depending on the selected memory master, the multiplexer 404 transfers interim check bytes for encoder circuitry 324 or interim partial syndromes for syndrome generator circuitry 328 to the RAM unit 326.

A demultiplexer 406 receives the data bytes of a data sector and routes the data bytes to either the encoder circuitry 324 or the syndrome generator circuitry in response to the read/write signal. The encoder circuitry 324 and the syndrome generator circuitry 328 access the interim check bytes and the interim partial syndromes, respectively, in the RAM unit 326 through a demultiplexer 408. The demultiplexer 408 routes the interim check bytes or syndromes as interim bytes to either the encoder circuitry 324 or the syndrome generator circuitry 328.

To enable access to the RAM unit 326, the RAM unit 326 provides a read port and a write port. Each port has associated read and write address pointers. In a preferred embodiment, the read and write address pointers are tied together and function as a single address pointer so that the data written to a particular location on the next clock cycle is a function of the content at the particular location and disk data at the current cycle. Then, the address pointer functions as a down counter when a new data byte comes in and wraps around to the maximum interleave number of a particular configuration upon reaching zero.

The RAM unit 326 comprises N×M bit array having N rows from row 0 through row N. To implement programmable interleaving degrees, an address pointer generator 402 receives an interleaving degree (ILD) signal, which may be entered by a user or programmed to be generated automatically. In response to the interleaving degree signal ILD, the address pointer generator 402 generates a starting interleaving address number. To compute check bytes (e.g., symbols) or partial syndromes for a particular interleaving degree when a new byte is being read in, the read and write pointer to the RAM unit 326 is controlled. For this purpose, the initial pointer address for the first byte of a data sector is derived from sector size and interleaving degrees. Once the initial pointer address has been determined, the address pointer is preferably decremented by 1 for implementing the programmable interleaving degree feature of the present invention. In other words, the address pointer behaves as a down counter when a new data byte comes in and wraps around to the maiximum interleave number of a particular configuration upon reaching 0.

Figure 5:
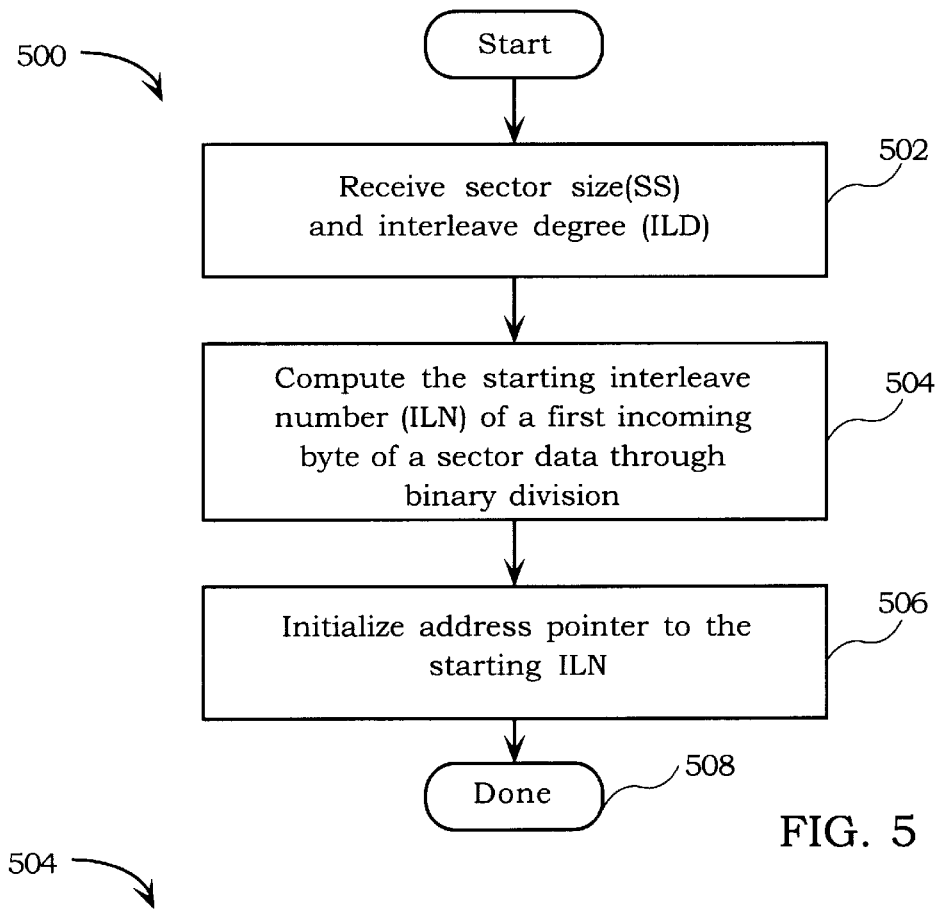
FIG. 5 illustrates a flow diagram of a method for determining a starting interleave number of a first incoming byte of a data sector.

FIG. 5 illustrates a flow diagram of a method 500 for determining a starting interleave number of a first incoming byte of a data sector. In operation 502, the method 500 receives sector size (SS) (e.g., total number of bytes in a sector) and interleave degree (ILD). Then in operation 504, the method 500 computes the starting interleave number (ILN) of the first incoming byte of a new data sector through binary division. The method 500 then initializes the address pointer to the computed starting ILN in operation 506. The method 500 then terminates in operation 508.

Figure 5A:
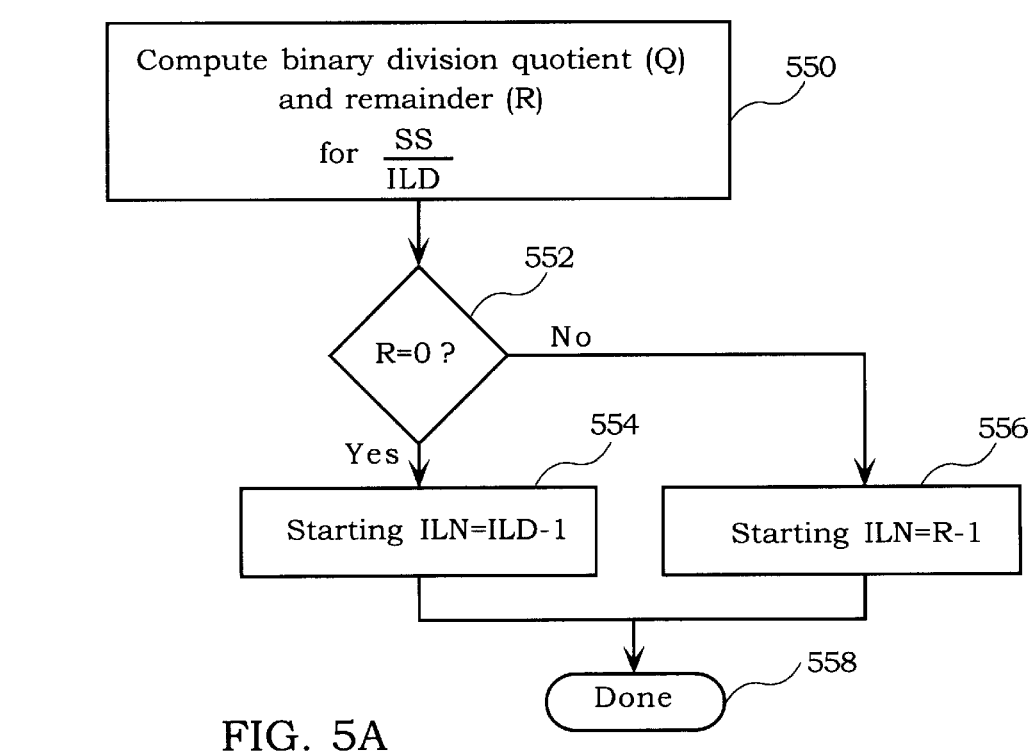
FIG. 5A illustrates a more detailed operations of for determining the starting interleave number of a first incoming byte of a new data sector through binary division.

FIG. 5A illustrates a more detailed operations of the operation 504 for interleave degree of N. In operation 550, the method 500 computes binary division quotient (Q) and remainder (R) for SS divided by ILD. The method 500 then determines whether the remainder R is zero in operation 552. If yes, the method 500 computes the starting ILN as (ILD-1) in operation 554. Otherwise, the method 500 determines the starting ILS as (R-1). The operation 504 terminates in operation 558.

In an alternative embodiment, the present invention may utilize the RAM unit 326 for both the ECC encoder 320 and the ECC decoder 328 by apportioning a block of the RAM unit 326 for each. In this case, an address pointer is provided for both the ECC encoder 320 and the ECC decoder 328.

Figure 6:
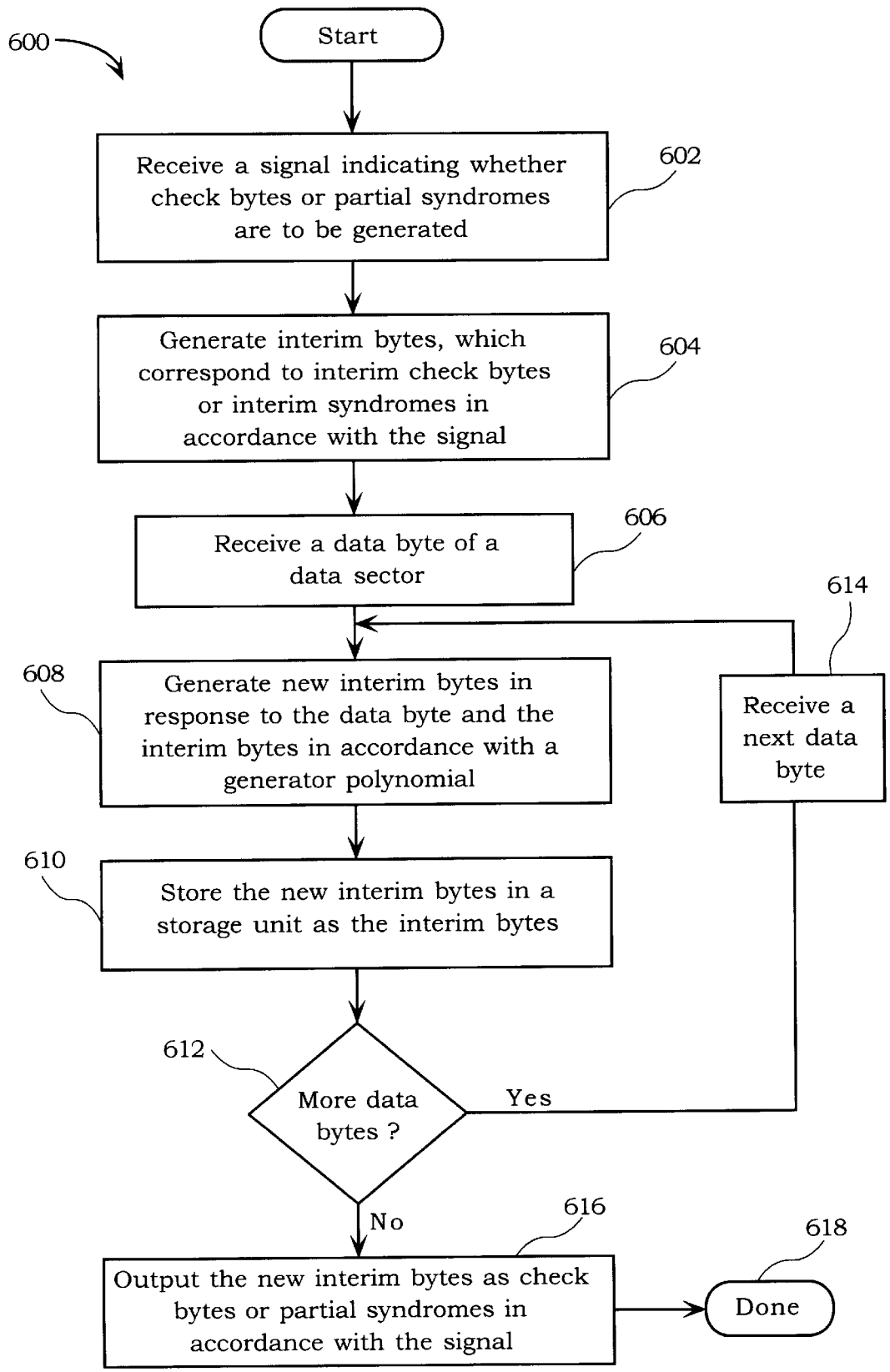
FIG. 6 illustrates the a flow chart of a method for generating check bytes or partial syndromes for a data sector in accordance with one embodiment of the present invention.

FIG. 6 illustrates the a flow chart of a method 600 for generating check bytes or partial syndromes for a data sector. In operation 602, the method 600 receives a signal indicating whether check bytes or partial syndromes are to be generated. A read/write signal may be used for this purpose. For example, a read signal indicates the generation of partial syndromes while a write signal indicates the generation of check bytes. Then in operation 604, the method 600 generates interim bytes, which correspond to interim check bytes or interim syndromes depending on the received signal. The method 600 receives a data byte of the data sector in operation 606. In operation 608, the method 600 generates new interim bytes in response to the data byte and the interim bytes in accordance with a generator polynomial. The generated new interim bytes are then stored in a storage unit (e.g., RAM) as the interim bytes, replacing the older interim bytes stored in the storage unit, if any.

In operation 612, the method 600 determines whether more data bytes remain in the data sector. If yes, the method 600 proceeds to receive a next data byte in operations 614. The method 600 then proceeds to generate new interim bytes in response to the next data byte and the interim bytes stored in the storage unit in operation 608. On the other hand, if all the data bytes in the data sector have been processed, the method 600 has generated new interim bytes for all the data bytes in the data sector. Accordingly, the method 600 proceeds to operation 616 and outputs the new interim bytes as the check bytes or partial syndromes in accordance with the signal. The method 600 terminates in operation 618.

Figure 1:
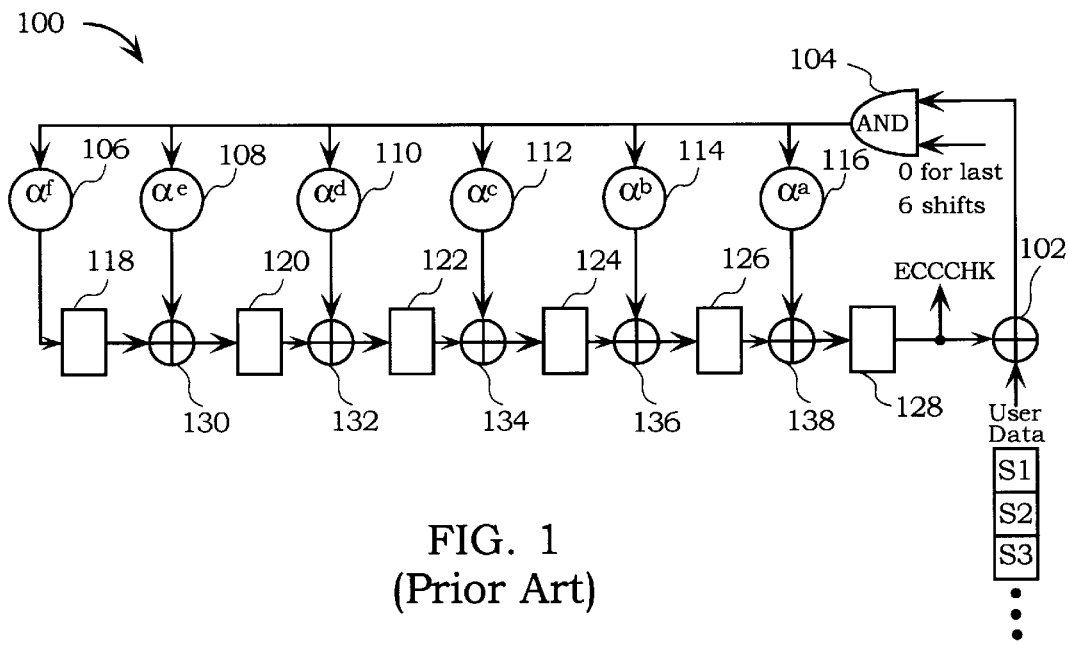
FIG. 1 illustrates a conventional ECC encoder for generating ECC check bytes employing a plurality of linear feedback shift registers.
Figure 7:
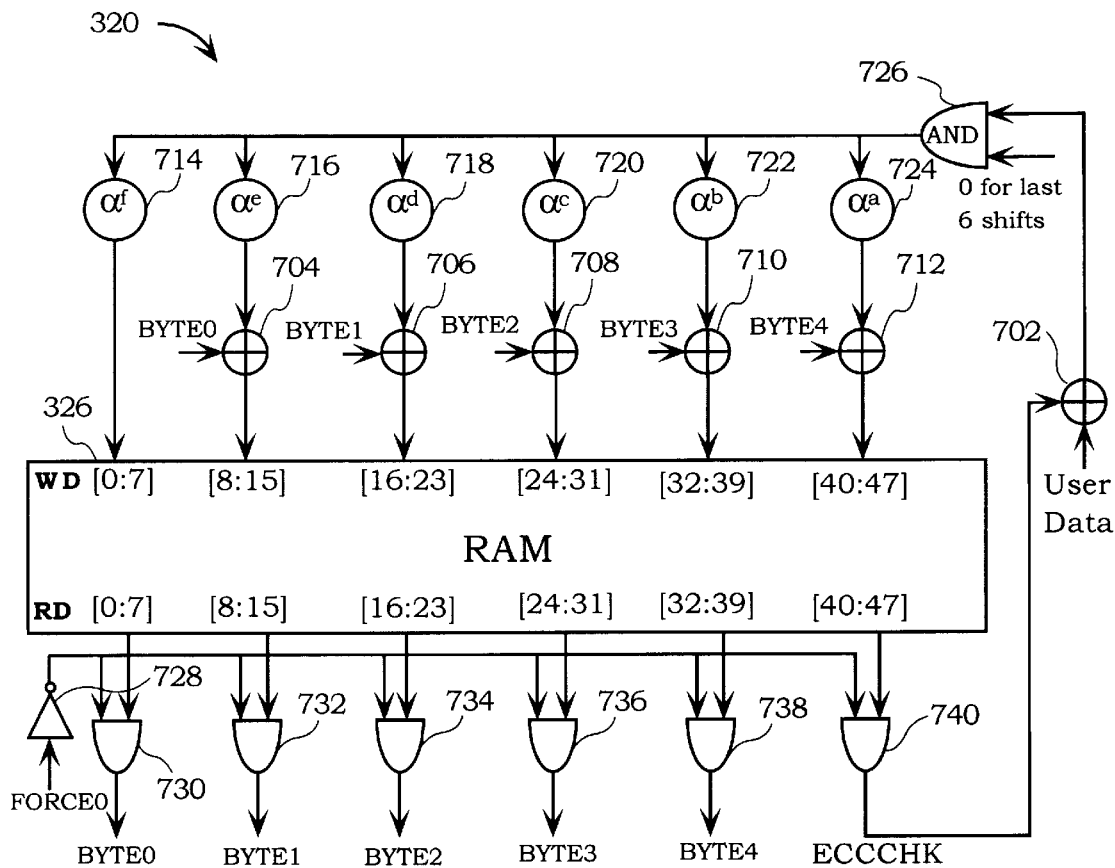
FIG. 7 illustrates a schematic diagram of an ECC encoder, which includes encoder circuitry and a RAM unit in accordance with one embodiment of the present invention.

FIG. 7 illustrates a schematic diagram of the ECC encoder 320, which includes the encoder circuitry 324 and the RAM unit 326 in accordance with one embodiment of the present invention. The encoder circuitry 324 includes a plurality of constant multipliers 714, 716, 718, 720, 722, and 724, a plurality of GF adders 702, 704, 706, 708, 710, and 712, a plurality of AND gates 726, 730, 732, 734, 736, 738, and 740, and an inverter 728. It should be borne in mind that the ECC encoder 320 implements the same generator polynomial implemented in Prior Art FIG. 1 for illustration. Even though the ECC encoder 320 is illustrated using such generator polynomial, those skilled in the art will readily appreciate that the ECC encoder 320 including the RAM unit 326 can be scaled to implement other generator polynomials.

The ECC encoder 320 sequentially receives user data sectors, one sector at a time and preferably one byte at a time. That is, the GF adder 702 (e.g., XOR gates) sequentially receives the sector data bytes as one input. The AND gate 726 receives the output of the GF adder 702 and transmits the output from the GF adder 702 to the constant multipliers 714, 716, 718, 720, 722, and 724 as long as the GF adder 702 is receiving a byte from the sector. In other words, the AND gate 726 receives an input signal "1" when the GF adder 702 transmits a data byte from a data sector. When all data bytes have been received, the input signal is switched to "0" to "shift" out the check bytes stored in the RAM unit 326.

The constant multipliers 714, 716, 718, 720, 722, and 724, respectively, multiplies constants $\alpha^f$, $\alpha^e$, $\alpha^d$, $\alpha^c$, $\alpha^b$, and $\alpha^a$, respectively, with the output of the AND gate 726. The constant multiplier 714 is coupled to the RAM unit 326 to feed the resulting product, of preferably byte width, to the RAM unit 326 for storage in bit locations [0:7]. The constant multipliers 716, 718, 720, 722, and 724 provides the products, also preferably of byte widths, to the GF adders 704, 706, 708, 710, and 712, respectively, as inputs. The GF adders 704, 706, 708, 710, and 712 are coupled to feed the respective outputs to bit locations [8:15], [16:23], [24:31], [32:39], and [40:47], respectively, of the RAM unit 326. The byte stored in the last byte position, i.e., bit positions [40:47], is labeled as ECCCHK byte and is input to the GF adder 702 for XOR-ring with incoming bytes of a sector.

To effectuate shifting, the GF adders 704, 706, 708, 710, 712, and 702 are coupled to the RAM unit 326 to receive bytes labeled BYTE0, BYTE1, BYTE2, BYTE3, BYTE4, ECCCHK, respectively, that were stored in the previous byte position in the RAM unit 326. In one embodiment, the ECC encoder 320 uses reset circuitry to initially force zeroes into the input bytes, BYTE0, BYTE1, BYTE2, BYTE3, BYTE4, and ECCCHK so that the GF adders 704, 706, 708, 710, 712, and 702 initially receive zero as an input.

Specifically, the AND gates 730, 732, 734, 736, 738, and 740 are coupled to receive an input from the RAM unit 326 corresponding to bit locations [0:7], [8:15], [16:23], [24:31], [32:39], and [40:47], respectively. The inverter 728 is coupled to provide the other input to each of the AND gates 730, 732, 734, 736, 738, and 740. The output of the AND gates 730, 732, 734, 736, 738, and 740 are coupled to the GF adders 704, 706, 708, 710, 712, and 702, respectively, such that a previous byte is used in processing the next byte.

In this configuration, when a binary signal "1" is input into the inverter 728, the inverter 728 inverts the input signal and provides a "0" input to each of the AND gates 730, 732, 734, 736, 738, and 740. The "0" input causes each of the AND gates 730, 732, 734, 736, 738, and 740 to output "0" for BYTE0, BYTE1, BYTE2, BYTE3, BYTE4, and ECCCHK, which are then input into the GF adders 704, 706, 708, 710, 712, and 702, respectively. With the "0" signal as one input, each of the GF adders 704, 706, 708, 710, 712, and 702 transmits the other input as the output. For example, the GF adder 704 merely transmits the input received from the constant multiplier 716 when BYTE0 is "0." In this manner, the ECC encoder circuitry 324 effectively resets the bytes provided to subsequent registers when a first byte of a new interleave is received. This reset scheme operates accordingly for the first byte of every interleave mode block. After the first byte, the forced reset condition is released by setting FORCE0 signal to binary "0."

Figure 2:
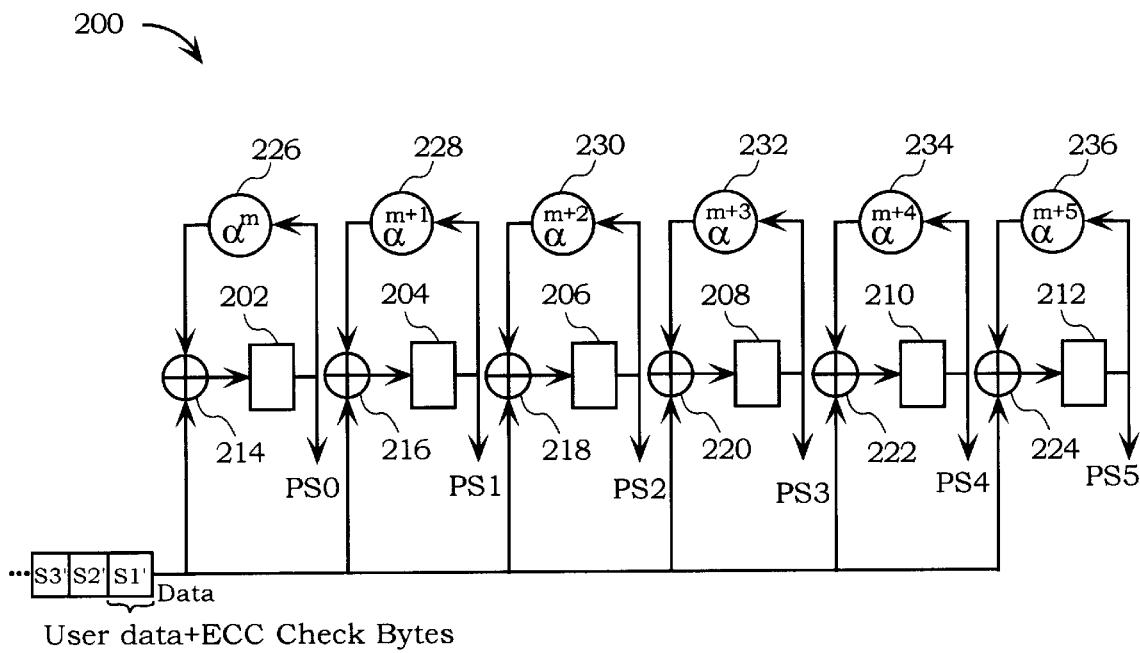
FIG. 2 illustrates a conventional ECC syndrome generator that generates partial syndromes PS0, PS1, PS2, PS3, PS4, and PS5 using a plurality of registers.
Figure 8:
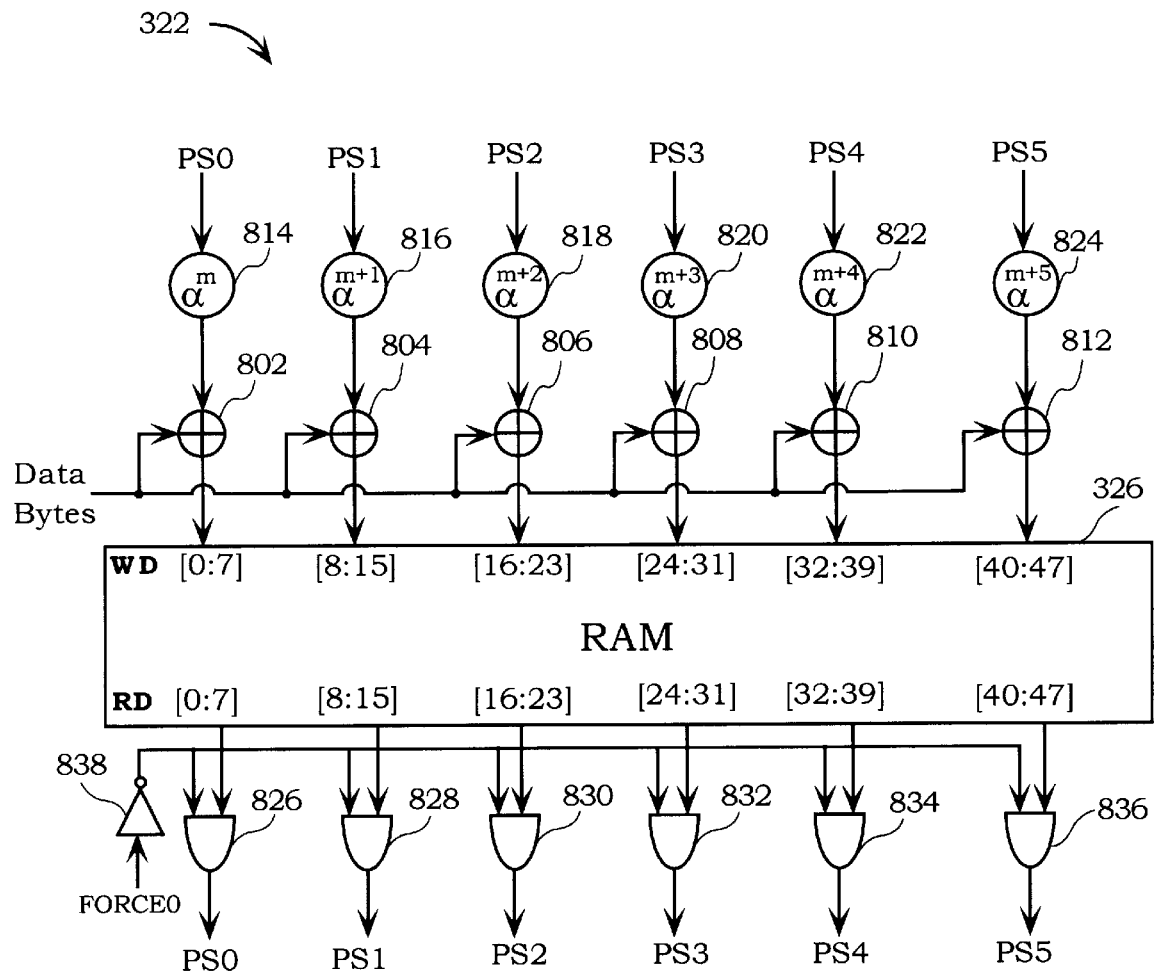
FIG. 8 illustrates a schematic diagram of an ECC syndrome generator including syndrome generator circuitry and a RAM unit in accordance with one embodiment of the present invention.

FIG. 8 illustrates a schematic diagram of the ECC syndrome generator 322 including syndrome generator circuitry 328 and the RAM unit 326 in accordance with one embodiment of the present invention. The syndrome generator circuitry 328 includes a plurality of constant multipliers 814, 816, 818, 820, 822, and 824, a plurality of GF adders 802, 804, 806, 808, 810, and 812, a plurality of AND gates 826, 828, 830, 832, 834, and 836, and an inverter 838. It should be borne in mind that the ECC syndrome generator 322 implements the same generator polynomial implemented in Prior Art FIG. 2 for illustration purposes. Even though the syndrome generator 322 is illustrated using such generator polynomial, those skilled in the art will no doubt recognize that the syndrome generator 322 including the RAM unit 326 can be scaled to implement other suitable generator polynomials.

The GF adders 802, 804, 806, 808, 810, and 812 sequentially receive ECC encoded data sectors, one sector at a time and preferably one byte at a time. The data sector comprises user data and a plurality of check bytes appended at the end of the user data portion. The plurality of GF adders 802, 804, 806, 808, 810, and 812 are configured to sequentially receive the data bytes as an input. The GF adders 802, 804, 806, 808, 810, and 812, respectively, are coupled to receive the outputs of constant multipliers 814, 816, 818, 820, 822, and 824, respectively, as an input. The GF adders 802, 804, 806, 808, 810, and 812 add the associated inputs through XOR operations and feed the outputs, i.e., interim syndromes (e.g., PS0, PS1, PS2, PS3, PS4, and PS5), to the RAM unit 326 for storage in bit positions [0:7], [8:15], [16:23], [24:31], [32:39], and [40:47], respectively.

The constant multipliers 814, 816, 818, 820, 822, and 824 receive interim syndromes PS0, PS1, PS2, PS3, PS4, and PS5, respectively, which were stored in the RAM unit 326 in bit positions [0:7], [8:15], [16:23], [24:31], [32:39], and [40:47], respectively. Initially, the syndrome generator 322 forces the interim syndromes PS0, PS1, PS2, PS3, PS4, and PS5 to be zero so that the first byte of every interleave can be transmitted and stored in the RAM unit 326 without modification.

In one embodiment, the ECC syndrome generator circuitry 328 includes reset circuitry to reset force the interim syndromes S0 through S5 to be zero. For this purpose, the AND gates 826, 828, 830, 832, 834, and 836 are configured to receive, as inputs, the stored interim syndromes in the RAM unit 326 in bit positions [0:7], [8:15], [16:23], [24:31],

[32:39], and [40:47], respectively. In addition, the AND gates 826, 828, 830, 832, 834, and 836 are coupled to the inverter 838 to receive an input for simulating reset to zero condition.

When the syndrome generator 322 detects a first byte of an interleaved sector, for example, it generates a binary signal "1," which is input into the inverter 838. The inverter 838 inverts the input signal into "0," which is then input into each of the AND gates 826 through 836. In response to the "0" input signal, each of the AND gates 826 through 836 outputs a binary signal "0" as the interim syndromes S0 through S5. In this manner, whatever the input signal received from the RAM unit 326, the constant multipliers 814 through 824 are assured of producing zeroes as outputs. Accordingly, the first byte of every interleave is transmitted and stored in the designated bit locations without modification. Then, the forced reset condition is released starting from the second data byte for each interleave block.

With reference still to FIG. 8, after receiving all bytes of a sector, the syndrome generator 322 generates a final set of interim syndromes, PS0, PS1, PS2, PS3, PS4, and PS5. The syndrome generator 322 designates and outputs these final interim syndromes as the partial syndromes for the sector. For on-the-fly processing, the generated partial syndromes may be stored in another storage unit (e.g., syndrome RAM 334) while the syndrome generator 322 processes a next sector in one embodiment of the present invention.

It should be noted that when interleaving degrees are programmable, the address pointers wrap around at different points. Accordingly, using the address pointers eliminates multiplexers in expanded shift register stages. The cost saving increases as the number of ECC check bytes appended to user data sectors increases.

Advantageously, the device and method for generating ECC check bytes and syndromes of the present invention utilize a random access memory (RAM) unit instead of shift registers. Furthermore, the RAM unit provides a scaleable storage unit for implementing programmable interleaves and accommodating varying number of check bytes and syndrome. Accordingly, the device and method of the present invention result in significant savings in cost and resources, particularly when the number of interleaves and the number of check bytes and syndromes increase.

While the present invention has been described in terms of several preferred embodiments, there are alterations, permutations, and equivalents which fall within the scope of this invention. It should also be noted that there are alternative ways of implementing both the device and device of the present invention. It is therefore intended that the following appended claims be interpreted as including all such alterations, permutations, and equivalents as fall within the true spirit and scope of the present invention.

What is claimed is:

1. An error correction code (ECC) encoder for generating ECC check bytes from a user data sector, which comprises a plurality of data bytes, the encoder comprising:
    a storage unit configured to receive and store a plurality of interim check bytes; and
    encoder circuitry configured to receive the data bytes of the user data sector sequentially and the interim check bytes to generate a plurality of new interim check bytes in accordance with a generator polynomial, the new interim check bytes being generated after each data byte of the data sector is received, the encoder circuitry being arranged to receive the interim check bytes from the storage unit such that the encoder circuitry generates the new interim check bytes and stores the generated new interim check bytes in contiguous byte locations in the storage unit as the interim check bytes, the interim check bytes stored in the storage unit corresponding to the ECC check bytes when the interim check bytes have been generated in response to all the bytes of the user data sector.

2. The ECC encoder as recited in claim 1, wherein the storage unit is a scaleable random access memory (RAM) unit, and wherein the encoder circuitry includes:
    a set of constant multipliers configured to generate a set of outputs in response to the data bytes of the user data sector, wherein one of the constant multipliers provides its output directly to one of the contiguous byte locations in the storage unit as one of the new interim check bytes; and
    a set of GF adders configured to generate the remaining new interim check bytes in response to the outputs of the remaining constant multipliers, wherein the remaining new interim check bytes are provided to the remaining contiguous byte locations in the storage unit.

3. The ECC encoder as recited in claim 2, wherein the RAM unit is configured as an N×M bit array, where N is the specified interleave degree and M is the number of check bits per interleave block.

4. The ECC encoder as recited in claim 1, wherein the encoder circuitry further comprises:
    reset circuitry arranged to generate and assign a specified reset value for the interim check bytes when a first data byte of the user data sector is received.

5. The ECC encoder as recited in claim 4, wherein the specified reset value is zero.

6. The ECC encoder as recited in claim 1, wherein the encoder circuitry outputs the ECC check bytes one at a time through the storage unit.

7. The ECC encoder as recited in claim 1, wherein the ECC encoder determines an interleave block for the generated interim check bytes in accordance with a specified interleave degree, the specified interleave degree determining the number of interleave blocks.

8. The ECC encoder as recited in claim 7, wherein the specified interleave degree is programmable.

9. The ECC encoder as recited in claim 7, wherein the storage unit is configured to receive and store the interim check bytes for each of the interleave blocks.

10. The ECC encoder as recited in claim 9, further comprising:
    an address pointer generator coupled to the storage unit and being configured to initialize an address pointer to a starting interleave block to receive a first byte of the user data sector in response to the specified interleave degree and the total number of data bytes in the user data sector.

11. The ECC encoder as recited in claim 10, wherein the address pointer is changed to point to a next interleave block when receiving a next data byte.

12. The ECC encoder as recited in claim 10, wherein the address pointer is decremented to point to a next interleave block.

13. A method for generating error correction coded (ECC) check bytes for a user data sector, which comprises a plurality of data bytes, the method comprising:
    (a) generating a plurality of interim check bytes;
    (b) receiving a data byte of the user sector;
    (c) generating a plurality of new interim check bytes in response to the received data byte and the interim check bytes in accordance with a generator polynomial;

(d) storing the new interim check bytes in contiguous byte locations in a storage unit as the interim check bytes; and (e) repeating operations (b) to (d) for all the data bytes of the user sector in sequence, the interim check bytes generated in response to all the data bytes corresponding to the ECC check bytes.

14. The method as recited in claim 13, wherein the storage unit is a scaleable random access memory (RAM) unit, and wherein the operation of generating the new interim bytes includes:

generating a set of outputs by a set of constant multipliers in response to the data bytes of the user data sector, wherein one of the constant multipliers provides its output directly to one of the contiguous byte locations in the storage unit as one of the new interim check bytes; and generating the remaining new interim check bytes by a set of GF adders in response to the outputs of the remaining constant multipliers, wherein the remaining new interim check bytes are provided to the remaining contiguous byte locations in the storage unit.

15. The method as recited in claim 14, wherein the RAM unit is configured as an N×M bit array, where N is the specified interleave degree and M is the number of check bits per interleave block.

16. The method as recited in claim 13, wherein interim check byte generating operation (a) comprises generating a reset value for the interim check bytes used in generating the new interim check bytes for a first data byte of the user data sector.

17. The method as recited in claim 16, wherein the reset value is zero.

18. The method as recited in claim 13, wherein the ECC check bytes are output through the storage unit.

19. The method as recited in claim 13, wherein the interim check byte storing operation (d) further comprises:

providing a plurality of interleave blocks in the storage unit in accordance with a specified interleave degree;

selecting an interleave block for the new interim check bytes; and storing the new interim check bytes into the selected interleave block in the storage unit as the interim check bytes.

20. The method as recited in claim 19, wherein the specified interleave degree is programmable.

21. The method as recited in claim 19, wherein the interleave block selecting further comprises:

receiving the specified interleave degree and the total number of data bytes in the user data sector;

determining a starting interleave block in the storage unit to receive a first byte of the user data sector in response to the specified interleave degree and the total number of data bytes in the user data sector; and selecting a next interleave block in the storage unit to receive a next data byte.

22. The method as recited in claim 21, wherein the next interleave block is contiguous to the starting interleave block in the storage unit.

23. An error correction code (ECC) encoder for generating ECC check bytes from a user data sector, which comprises a plurality of data bytes, the encoder comprising:

storing means for receiving and storing a plurality of interim check bytes; and encoding means for generating a plurality of new interim check bytes in response to the data bytes of the user data sector and the interim check bytes in accordance with a generator polynomial, the new interim check bytes being generated after each data byte of the data sector is received, the encoding means being arranged to receive the interim check bytes from the storing means for generating the new interim check bytes, which are stored in contiguous byte locations in the storing means as the interim check bytes, such that the interim check bytes correspond to the ECC check bytes when the interim check bytes have been generated in response to all the bytes of the user data sector.

24. The ECC encoder as recited in claim 23, wherein the storing means is a scaleable random access memory (RAM) unit, and wherein the encoding means includes:

a set of constant multipliers configured to generate a set of outputs in response to the data bytes of the user data sector, wherein one of the constant multipliers provides its output directly to one of the contiguous byte locations in the storage unit as one of the new interim check bytes; and a set of GF adders configured to generate the remaining new interim check bytes in response to the outputs of the remaining constant multipliers, wherein the remaining new interim check bytes are provided to the remaining contiguous byte locations in the storage unit.

25. The ECC encoder as recited in claim 24, wherein the RAM unit is configured as an N×M bit array, where N is the specified interleave degree and M is the number of check bits per interleave block.

26. The ECC encoder as recited in claim 23, wherein the encoding means further comprises:

reset means for generating and assigning a specified reset value for the interim check bytes when a first data byte of the user data sector is received.

27. The ECC encoder as recited in claim 23, wherein the encoding means outputs the ECC check bytes one at a time through the storing means.

28. The ECC encoder as recited in claim 23, wherein the ECC encoder determines an interleave block for the generated interim check bytes in accordance with a specified interleave degree, the specified interleave degree determining the number of interleave blocks.

29. The ECC encoder as recited in claim 28, wherein the specified interleave degree is programmable.

30. The ECC encoder as recited in claim 28, wherein the storing means is configured to receive and store the interim check bytes for each of the interleave blocks.

31. The ECC encoder as recited in claim 30, further comprising:

an address pointer generating means coupled to the storing means and being configured to initialize an address pointer to a starting interleave block to receive a first byte of the user data sector in response to the specified interleave degree and the total number of data bytes in the user data sector.

32. The ECC encoder as recited in claim 31, wherein the address pointer is changed to point to a next interleave block when receiving a next data byte.

33. A syndrome generator for generating partial syndromes from a data sector, which comprises a plurality of data bytes, the syndrome generator comprising:

a storage unit configured to receive and store a plurality of interim syndromes; and syndrome generator circuitry configured to receive the data bytes of the data sector sequentially and the interim syndromes to generate a plurality of new interim syndromes in accordance with a generator polynomial, the new interim syndromes being generated after each data byte of the data sector is received, the syndrome generator circuitry being arranged to receive the interim syndromes from the storage unit such that the syndrome generator circuitry generates the new interim syndromes and stores the generated new interim syndromes in contiguous byte locations in the storage unit as the interim syndromes, the interim syndromes corresponding to the partial syndromes when the interim syndromes have been generated in response to all the bytes of the data sector.

34. The syndrome generator as recited in claim 33, wherein the storage unit is a scaleable random access memory (RAM) unit, and wherein the syndrome generator circuitry includes:

a set of GF adders configured to generate the new interim syndromes in response to the data bytes of the data sector, wherein the new interim syndromes are provided to the contiguous byte locations in the storage unit; and a set of constant multipliers configured to generate a set of outputs in response to the stored interim syndromes, wherein the set of GF adders are coupled to receive the set of outputs from the constant multipliers to generate the new interim syndromes.

35. The syndrome generator as recited in claim 34, wherein the RAM unit is configured as an N×M bit array, where N is the specified interleave degree and M is the number of bits per interleave block.

36. The syndrome generator as recited in claim 33, wherein the syndrome generator circuitry further comprises:

reset circuitry arranged to generate and assign a specified reset value for the interim syndromes when a first data byte of the data sector is received.

37. The syndrome generator as recited in claim 36, wherein the specified reset value is zero.

38. The syndrome generator as recited in claim 33, wherein the syndrome generator circuitry outputs the partial syndromes through the storage unit.

39. The syndrome generator as recited in claim 33, wherein the ECC syndrome generator determines an interleave block for the generated interim syndromes in accordance with a specified interleave degree, the specified interleave degree determining the number of interleave blocks.

40. The syndrome generator as recited in claim 39, wherein the specified interleave degree is programmable.

41. The syndrome generator as recited in claim 39, wherein the storage unit is configured to receive and store the generated interim syndromes for each of the interleave blocks.

42. The syndrome generator as recited in claim 41, further comprising:

an address pointer generator coupled to the storage unit and being configured to initialize an address pointer to a starting interleave block to receive a first byte of the data sector in response to the specified interleave degree and the total number of data bytes in the data sector.

43. The syndrome generator as recited in claim 42, wherein the address pointer is changed to point to a next interleave block when receiving a next data byte.

44. The syndrome generator as recited in claim 42, wherein the address pointer is decremented to point to a next interleave block.

45. A method for generating partial syndromes from a data sector, which comprises a plurality of data bytes, the method comprising:

(a) generating a plurality of interim syndromes;

(b) receiving a data byte of the data sector;

(c) generating a plurality of new interim syndromes in response to the received data byte and the interim syndromes accordance with a generator polynomial;

(d) storing the new interim syndromes in contiguous byte locations in a storage unit as the interim syndromes; and (e) repeating operations (b) to (d) for all the data bytes of the data sector in sequence, the interim syndromes generated in response to all the data bytes corresponding to the partial syndromes.

46. The method as recited in claim 45, wherein the storage unit is a scaleable random access memory (RAM) unit, and wherein the operation of generating the new interim syndromes includes:

generating the new interim syndromes by a set of GF adders in response to the data bytes of the data sector, wherein the new interim syndromes are provided to the contiguous byte locations in the storage unit; and generating a set of outputs by a set of constant multipliers in response to the stored interim syndromes, wherein the set of GF adders are coupled to receive the set of outputs from the constant multipliers to generate the new interim syndromes.

47. The method as recited in claim 46, wherein the RAM unit is configured as an N×M bit array, where N is the specified interleave degree and M is the maximum number of bits per interleave block.

48. The method as recited in claim 45, wherein the interim syndrome generating operation (a) comprises generating a reset value for the interim syndromes used in generating the new interim syndromes for a first data byte of the data sector.

49. The method as recited in claim 48, wherein the reset value is zero.

50. The method as recited in claim 45, wherein the partial syndromes are output through the storage unit.

51. The method as recited in claim 45, wherein the interim syndrome storing operation (d) further comprises:

providing a plurality of interleave blocks in the storage unit in accordance with a specified interleave degree;

selecting an interleave block for the generated new interim syndromes; and storing the new interim syndromes into the selected interleave block in the storage unit as the interim syndromes.

52. The method as recited in claim 51, wherein the specified interleave degree is programmable.

53. The method as recited in claim 51, wherein the interleave block selecting further comprises:

receiving the specified interleave degree and the total number of data bytes in the data sector;

determining a starting interleave block in the storage unit to receive a first byte of the data sector in response to the specified interleave degree and the total number of data bytes in the data sector; and selecting a next interleave block in the storage unit to receive a next data byte.

54. The method as recited in claim 53, wherein the next interleave block is contiguous with the starting interleave block in the storage unit.

55. A syndrome generator for generating partial syndromes from a data sector, which comprises a plurality of data bytes, the syndrome generator comprising:

storing means for receiving and storing a plurality of interim syndromes; and syndrome generating means for generating a plurality of new interim syndromes in response to the data bytes of the data sector and the interim syndromes in accordance with a generator polynomial, the new interim syndromes being generated in response to each data byte of the data sector is received, the syndrome generating means being arranged to receive the interim syndromes from the storing means for generating the new interim syndromes, which are stored in contiguous byte locations in the storing means as the interim syndromes, the interim syndromes being the partial syndromes when the interim syndromes have been generated in response to all the bytes of the data sector.

56. The syndrome generator as recited in claim 55, wherein the storing means is a scaleable random access memory (RAM) unit, and wherein the syndrome generating means comprises:

a set of GF adders configured to generate the new interim syndromes in response to the data bytes of the data sector, wherein the new interim syndromes are provided to the contiguous byte locations in the storage unit; and a set of constant multipliers configured to generate a set of outputs in response to the stored interim syndromes, wherein the set of GF adders are coupled to receive the set of outputs from the constant multipliers to generate the new interim syndromes.

57. The syndrome generator as recited in claim 56, wherein the RAM unit is configured as an N×M bit array, where N is the specified interleave degree and M is a maximum number of bits per interleave block.

58. The syndrome generator as recited in claim 55, wherein the syndrome generating means further comprises:

reset means for generating and assigning a specified reset value for the interim syndromes before receiving a first data byte of the data sector.

59. The syndrome generator as recited in claim 55, wherein the syndrome generator means outputs the partial syndromes through the storing means.

60. The syndrome generator as recited in claim 55, wherein the syndrome generating means determines an interleave block for the generated interim syndromes in accordance with a specified interleave degree, the specified interleave degree determining the number of interleave blocks.

61. The syndrome generator as recited in claim 60, wherein the specified interleave degree is programmable.

62. The syndrome generator as recited in claim 60, wherein the storing means is configured to receive and store the interim syndromes for each of the interleave blocks.

63. The syndrome generator as recited in claim 62, further comprising:

an address pointer generating means coupled to the storing means for initializing an address pointer to a starting interleave block to receive a first byte of the data sector in response to the specified interleave degree and the total number of data bytes in the data sector.

64. The syndrome generator as recited in claim 63, wherein the address pointer is changed to point to a next interleave block when receiving a next data byte.

65. A device for generating error correction code (ECC) check bytes and partial syndromes from a data sector using a single shared memory unit, the data sector comprising a plurality of data bytes, the device receiving a signal indicating whether the data sector is to be written to or read from a storage medium coupled to the device, the device generating the check bytes when the signal indicates a write operation to the storage medium and the device generating the partial syndromes when the signal indicates a read operation from the storage medium, the device comprising:

a storage unit configured to receive and store a plurality of interim data bytes;

encoder circuitry configured to sequentially receive the data bytes of the data sector and the interim data bytes to generate a plurality of interim check bytes in accordance with a first generator polynomial when the signal indicates the write operation, the interim check bytes being generated after each data byte of the data sector is received, the encoder circuitry being arranged to store the interim check bytes in contiguous byte locations in the storage unit as the interim data bytes, the interim data bytes corresponding to the check bytes when the interim check bytes have been generated in response to all the bytes of the user data sector; and syndrome generator circuitry configured to sequentially receive the data bytes of the data sector and the interim data bytes to generate a plurality of interim syndromes in accordance with a second generator polynomial when the signal indicates the read operation, the interim syndromes being generated after each data byte of the data sector is received, the syndrome generator circuitry being arranged to store the interim syndromes in the contiguous byte locations in the storage unit as the interim data bytes, the interim data bytes corresponding to the partial syndromes when the interim syndromes have been generated in response to all the bytes of the user data sector.

66. The device as recited in claim 65, wherein the storage unit is a scaleable random access memory (RAM) unit, and wherein the encoder circuitry includes:

a set of constant multipliers configured to generate a set of outputs in response to the data bytes of the user data sector, wherein one of the constant multipliers provides its output directly to one of the continuous byte locations in the storage unit as one of the new interim check bytes; and a set of GF adders configured to generate the remaining new interim check bytes in response to the outputs of the remaining constant multipliers, wherein the remaining new interim check bytes are provided to the remaining contiguous byte locations in the storage unit.

67. The device as recited in claim 65, further comprising:

reset circuitry arranged to generate and assign a specified reset value for the interim data bytes when a first data byte of the user data sector is received.

68. The device as recited in claim 67, wherein the specified reset value is zero.

69. The device as recited in claim 65, wherein the encoder circuitry outputs the interim data bytes one at a time through the storage unit.

70. The device as recited in claim 65, wherein the device determines an interleave block for the generated interim data bytes in accordance with a specified interleave degree, the specified interleave degree determining the number of interleave blocks.

71. The device as recited in claim 70, wherein the specified interleave degree is programmable.

72. The device as recited in claim 70, wherein the storage unit is configured to receive and store the interim data bytes for each of the interleave blocks.

73. The device as recited in claim 72, further comprising:

an address pointer generator coupled to the storage unit and being configured to initialize an address pointer to a starting interleave block to receive a first byte of the user data sector in response to the specified interleave degree and the total number of data bytes in the data sector.

74. The device as recited in claim 73, wherein the address pointer is changed to point to a next interleave block when receiving a next data byte.

75. The device as recited in claim 73, wherein the address pointer is decremented to point to a next interleave block.

76. The device as recited in claim 65, wherein the RAM unit is configured as an N×M bit array, where N is the specified interleave degree and M is the maximum number of bits per interleave block.

77. The device as recited in claim 65, further comprising:
a multiplexer arrangement configured to transmit the interim data bytes between the storage unit and the encoder circuitry when the signal indicates the write operation and the multiplexer arrangement being configured to transmit the interim data bytes between the storage unit and the syndrome generator circuitry when the signal indicates the read operation.

78. A method for generating error correction coded (ECC) check bytes and partial syndromes from a data sector using a single shared memory unit, the data sector comprising a plurality of data bytes, the method comprising:
(a) receiving a signal indicating whether the check bytes or the partial syndromes are to be generated for the data sector;
(b) generating a plurality of interim bytes, the interim bytes being interim check bytes when the signal indicates the generation of the check bytes and the interim bytes being interim syndromes when the signal indicates the generation of the partial syndromes;
(c) receiving a data byte of the data sector;
(d) generating a plurality of new interim bytes in response to the received data byte and the interim bytes in accordance with a generator polynomial;
(e) storing the new interim bytes in contiguous byte locations in a storage unit as the interim bytes; and
(f) repeating operations (c) to (e) for all the data bytes of the data sector in sequence, the interim bytes generated in response to all the data bytes corresponding to the check bytes when the signal indicates the generation of the check bytes, and the interim bytes generated in response to all the data bytes corresponding to the partial syndromes when the signal indicates the generation of the partial syndromes.

79. The method as recited in claim 78, wherein the storage unit is a scaleable random access memory (RAM) unit, and wherein the encoder circuitry includes:
a set of constant multipliers configured to generate a set of outputs in response to the data bytes of the user data sector, wherein one of the constant multipliers provides its output directly to one of the contiguous byte locations in the storage unit as one of the new interim check bytes; and
a set of GF adders configured to generate the remaining new interim check bytes in response to the outputs of the remaining constant multipliers, wherein the remaining new interim check bytes are provided to the remaining contiguous byte locations in the storage unit.

80. The method as recited in claim 79, wherein the RAM unit is configured as an N×M bit array, where N is the specified interleave degree and M is the number of check bits per interleave block.

81. The method as recited in claim 78, wherein the interim byte generating operation (b) comprises generating a reset value for the interim bytes used in generating the new interim bytes for the first data byte of the data sector.

82. The method as recited in claim 81, wherein the reset value is zero.

83. The method as recited in claim 78, wherein the interim bytes are output through the storage unit.

84. The method as recited in claim 78, wherein the interim byte storing operation (e) further comprises:
providing a plurality of interleave blocks in the storage unit in accordance with a specified interleave degree;
selecting an interleave block for the generated new interim bytes; and
storing the new interim bytes into the selected interleave block in the storage unit as the interim bytes.

85. The method as recited in claim 84, wherein the specified interleave degree is programmable.

86. The method as recited in claim 84, wherein the interleave block selecting further comprises:
receiving the specified interleave degree and the total number of data bytes in the data sector;
determining a starting interleave block in the storage unit to receive a first byte of the data sector in response to the specified interleave degree and the total number of data bytes in the data sector; and
selecting a next interleave block in the storage unit to receive a next data byte.

87. The method as recited in claim 86, wherein the next interleave block is contiguous to the starting interleave block in the storage unit.

88. A device for generating error correction code (ECC) check bytes and partial syndromes from a data sector using a single shared memory unit, the data sector comprising a plurality of data bytes, the device receiving a signal indicating whether the data sector is to be written to or read from a storage medium coupled to the device, the device generating the check bytes when the signal indicates a write operation to the storage medium and the device generating the partial syndromes when the signal indicates a read operation from the storage medium, the device comprising:
storing means for receiving and storing a plurality of interim data bytes;
encoding means configured to sequentially receive the data bytes of the data sector and the interim data bytes to generate a plurality of interim check bytes in accordance with a first generator polynomial when the signal indicates the write operation, the interim check bytes being generated after each data byte of the data sector is received, the encoding means being arranged to store the interim check bytes in contiguous byte locations in the storing means as the interim data bytes, the interim data bytes corresponding to the check bytes when the interim check bytes have been generated in response to all the bytes of the user data sector; and
syndrome generating means configured to sequentially receive the data bytes of the data sector and the interim data bytes for generating a plurality of interim syndromes in accordance with a second generator polynomial when the signal indicates the read operation, the interim syndromes being generated after each data byte of the data sector is received, the syndrome generating means being arranged to store the interim syndromes in the contiguous byte locations in the storing means as the interim data bytes, the interim data bytes corresponding to the partial syndromes when the interim syndromes have been generated in response to all the bytes of the user data sector.

89. The device as recited in claim 88, wherein the storing means is a scaleable random access memory (RAM) unit, and wherein the encoder circuitry includes:

a set of constant multipliers configured to generate a set of outputs in response to the data bytes of the user data sector, wherein one of the constant multipliers provides its output directly to one of the contiguous byte locations in the storage unit as one of the new interim check bytes; and a set of GF adders configured to generate the remaining new interim check bytes in response to the outputs of the remaining constant multipliers, wherein the remaining new interim check bytes are provided to the remaining contiguous byte locations in the storage unit.

90. The device as recited in claim 88, further comprising:

resetting means arranged to generate and assign a specified reset value for the interim data bytes when a first data byte of the user data sector is received.

91. The device as recited in claim 90, wherein the specified reset value is zero.

92. The device as recited in claim 88, further comprising output means for outputting the interim data bytes through the storing means.

93. The device as recited in claim 88, wherein the device determines an interleave block for the generated interim data bytes in accordance with a specified interleave degree, the specified interleave degree determining the number of interleave blocks.

94. The device as recited in claim 93, wherein the specified interleave degree is programmable.

95. The device as recited in claim 93, wherein the storing means is configured to receive and store the interim data bytes for each of the interleave blocks.

96. The device as recited in claim 93, further comprising:

an address pointer generating means coupled to the storage unit and being configured to initialize an address pointer to a starting interleave block to receive a first byte of the user data sector in response to the specified interleave degree and the total number of data bytes in the data sector.

97. The device as recited in claim 96, wherein the address pointer is changed to point to a next interleave block when receiving a next data byte.

98. The device as recited in claim 96, wherein the address pointer is decremented to point to a next interleave block.

99. The device as recited in claim 88, wherein the storing means is configured as an N×M bit array, where N is the specified interleave degree and M is the maximum number of bits per interleave block.

100. The device as recited in claim 88, further comprising:

multiplexing means configured to transmit the interim data bytes between the storing means and the encoding means when the signal indicates the write operation, the multiplexing being configured to transmit the interim data bytes between the storing means and the syndrome generating means when the signal indicates the read operation.

* * * * *